United States Patent
Kerschbaumer

(10) Patent No.: US 9,564,300 B2
(45) Date of Patent: Feb. 7, 2017

(54) CENTERING OF A PLATE IN A HOLDER BOTH AT ROOM TEMPERATURES AND AT HIGHER TEMPERATURES

(71) Applicant: Oerlikon Surface Solutions AG, Trübbach, Trübbach (CH)

(72) Inventor: Joerg Kerschbaumer, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 14/783,383

(22) PCT Filed: Apr. 7, 2014

(86) PCT No.: PCT/EP2014/000928
§ 371 (c)(1),
(2) Date: Oct. 8, 2015

(87) PCT Pub. No.: WO2014/166621
PCT Pub. Date: Oct. 16, 2014

(65) Prior Publication Data
US 2016/0071706 A1    Mar. 10, 2016

Related U.S. Application Data

(60) Provisional application No. 61/809,524, filed on Apr. 8, 2013.

(51) Int. Cl.
*C23C 14/34* (2006.01)
*H01J 37/34* (2006.01)

(52) U.S. Cl.
CPC ....... *H01J 37/3435* (2013.01); *C23C 14/3407* (2013.01); *H01J 37/3438* (2013.01); *H01J 37/3467* (2013.01); *H01J 37/3497* (2013.01)

(58) Field of Classification Search
CPC ............... C23C 14/3407; H01J 37/3435; H01J 37/3438; H01J 37/3467; H01J 37/3497
USPC ....................................... 204/298.12, 298.13
See application file for complete search history.

(56) References Cited

U.S. PATENT DOCUMENTS 5,269,894 A * 12/1993 Kerschbaumer .... C23C 14/3407
204/192.12

FOREIGN PATENT DOCUMENTS

| DE | 19535894 A1 | 4/1997 |
|---|---|---|
| EP | 0393344 A1 | 10/1990 |
| EP | 0512456 A1 | 11/1992 |
| EP | 1106715 A1 | 6/2001 |
| JP | 2003226967 A | 8/2003 |
| JP | 2010116605 A | 5/2010 |
| WO | 2013149692 A1 | 10/2013 |

OTHER PUBLICATIONS

Machine Translation of 2003-226967 dated Aug. 2003.*
Kaneka Corporation: "Graphinity," 2010; URL: http://www.elecdiv.kaneka.co.jp/english/graphite/index.html (retrieved on Aug. 14, 2014).

(Continued)

*Primary Examiner* — Rodney McDonald

(57) ABSTRACT

A system that has a plate with a holder, in which the plate is centered in the holder both at room temperatures and at higher temperatures, independently of the thermal expansion of the plate and the holder, and in which the plate can freely expand in the holder at higher temperatures.

16 Claims, 7 Drawing Sheets

(56) References Cited

OTHER PUBLICATIONS

"Hochwärmeleitende Karbonfolien Serie KU-CB1200," Internet Citation, Nov. 30, 2010; URL: http://www.heatmanagement.com/local/media/hmproducts/ku-cbl200-50/ku-cb1200_datenblatt.pdf (retrieved on May 16, 2013).

* cited by examiner

CENTERING OF A PLATE IN A HOLDER BOTH AT ROOM TEMPERATURES AND AT HIGHER TEMPERATURES

FIELD OF THE INVENTION

The present invention relates to a system that has a plate with a holder, in which the plate is centered in the holder both at room temperatures and at higher temperatures, independently of the thermal expansion of the plate and the holder, and in which the plate can freely expand in the holder at higher temperatures.

BACKGROUND OF THE INVENTION

These days, coatings are produced, among other things, using sputtering processes and arc processes, which are part of so-called PVD processes (PVD: physical vapor deposition). In this technique, targets are pulverized or vaporized. In these processes, the targets get hot and must be cooled.

According to the prior art, the cooling is carried out for example by means of a so-called cooling plate of the foil cooling plate type, which cools the back of the target, as shown in FIG. 2. The pressure of the cooling medium presses the foil against the target and thus achieves a good thermal conduction from the cooling medium to the target.

Depending on the power input, the heat dissipation via the cooling plate, and the thermal conductivity of the target material, the targets are heated differently and expand in accordance with their longitudinal expansion coefficients. The target in this case must be able to expand freely so that it is not destroyed.

For process-related reasons, it is important for the target resting on the cooling, plate to expand concentrically to the cooling plate axis so that during the entire operation, a concentric gap can be ensured between the target and the surrounding components or the surrounding component. In particular, it is very important for the target to expand in a centered fashion relative to the cooling plate axis in order to avoid short-circuits that can occur, for example, if the target is operated as a cathode and the target has an anode ring positioned around it, to which a different electrical potential is applied, as shown for example in FIG. 2.

If the target is not correctly centered, then the target does not expand concentrically enough. As a result, electrical short-circuiting can occur between the anode ring and the expanded target.

In the present example, the position of the target relative to the anode ring is determined by its position on the cooling plate. With a small gap between the cooling plate and target, the position of the target is sufficiently defined and no contact occurs between the target and anode. This small gap, however, strictly limits the possible expansion of the target. The maximum permissible target temperature or operating temperature is thus predetermined and the maximum sputtering power is thus limited. The smaller the gap, the lower the permissible sputtering power is.

With a larger gap, the target is as a rule positioned eccentrically on the cooling plate. In addition, the eccentric support causes the mechanical stresses in the target to be uneven during the operation of foil cooling plates. Depending on the target material, this can result in permissible mechanical stresses being exceeded.

The object of the present invention is to create a plate-holding device system that makes it possible to keep a plate centered in a holder device regardless of the temperature of the system; the plate is able to freely expand in the holder device so that it is not destroyed during the expansion process.

SUMMARY OF THE INVENTION

The object of the present invention is attained by creating a system "plate-holder."

The system according to the present invention has a plate and a holder; the plate has a surface with an outer plate edge and the material of the plate has a first thermal expansion coefficient and the holder has an opening, which is delimited by an inner holder edge, and the material of the holder has a second thermal expansion coefficient, and the first thermal expansion coefficient is greater than the second thermal expansion coefficient, wherein
at room temperature, the circumference of the opening of the holder is greater than the circumference of the surface of the plate, as a result of which with a centered position of the plate, there is a gap with a defined gap width S between the plate edge and the inner holder edge
the plate edge has one or more protrusions, which extend along the radial direction relative to the plate edge surface and engage in corresponding recesses of the holder edge and/or the plate edge has one or more recesses, which extend along the radial direction relative to the plate edge surface and are engaged by corresponding protrusions of the holder edge
in which the plate-holding system has at least three such recess/protrusion pairs that engage each other and each recess and each protrusion has a respective length in the radial direction relative to the plate edge surface and a respective width and the width of a recess is greater than the width of the corresponding protrusion, for each recess/protrusion pair at room temperature, the smallest width difference sp between the recess and protrusion is smaller than the above-mentioned gap width S, in the radial direction, the smallest gap width between the recess and protrusion is greater than the above-mentioned smallest width difference sp, preferably at least as great as the above-mentioned gap width S, thus achieving, the fact that both at room temperature and at higher temperatures, the plate is always anchored so that it is centered in the holder since the recess/protrusion pairs function as guide rails.

In the sense of the present description, the term "radial direction" is understood to be defined as follows: If the plate is affixed to an axis that extends perpendicular to the plate surface and through its center of gravity, then the radial direction at a location on the outer plate edge is the respective direction in which the location on the outer plate edge moves when a temperature increase occurs. With a disc-shaped plate that has a circular edge, this is the direction perpendicular to the plate edge, extending away from the center point of the circle.

FIG. 8 schematically depicts this in a plate with a rectangular surface. The plate with the protrusions and the holder are depicted with cross-hatching. The straight lines pass through the center of gravity of the plate and by definition, indicate the radial direction at the plate edge. In the figure, it is also clear that the gap width S does not have to be the same all around the plate edge, but can instead be selected as a function of the geometry.

According to the present invention, all gap widths between the plate edge and the inner holder edge, including gap widths between recesses and protrusions, taking into account the dimensions and thermal expansion coefficient of the plate and the holder, are selected so that the plate can expand freely in the holder when higher temperatures occur. Since the thermal expansion in solids primarily depends significantly on the lattice structure and the bonding conditions, the linear equations only constitute approximations.

The expansion coefficient or heat expansion coefficient is a value that describes the behavior of a material with regard to changes in its dimensions when temperature changes occur and is therefore also often referred to as the thermal expansion coefficient. Thermal expansion is the effect that is responsible for this. The thermal expansion depends on the material used; it is therefore a material-specific material constant. Since the thermal expansion in many materials does not occur uniformly across all temperature ranges, the thermal expansion coefficient itself is temperature-dependent and is therefore indicated, for a particular reference temperature or a particular temperature range.

A distinction is drawn between the longitudinal thermal expansion coefficient α (also known as the linear thermal expansion coefficient) and the spatial thermal expansion coefficient γ (also known as the spatial expansion coefficient, the volumetric expansion coefficient, or the cubic expansion coefficient).

The longitudinal expansion coefficient α is the proportionality constant between the temperature change dT and the relative length change dL/L of a solid, it is therefore used to describe the relative length change that occurs with a temperature change. It is a material-specific value whose unit of measure is $K^{-1}$ (per Kelvin) and is defined by the following equation: $\alpha=1/L \cdot dl/dT$; in simplified form, the equation would be $L_{final} \approx L_{initial} \cdot (1+\alpha \cdot \Delta T)$.

It would then be possible, for example, to calculate what length the plate would have in a particular direction of the plate surface at a maximum operating temperature. In a similar way, the dimensions could be calculated according to the thermal expansion of the holder. It is thus possible to calculate the gap widths between the plate and the holder that are necessary to ensure the free thermal expansion of the plate in the holder up to the maximum operating temperature.

It can be assumed, for example, that $L_{1final} \approx \alpha_1 \cdot L_{1initial} \cdot \Delta T_1$, where $L_{1final}$ is the length of the plate in a particular direction (i.e. the diameter in the case of a disc-shaped plate) at a temperature $T_{final}$ (for example at the maximum operating temperature of the plate), $\alpha_1$ is the linear thermal expansion coefficient of the plate in the operating temperature range. $L_{1initial}$ is the length of the plate in the same direction, but at a temperature $T_{initial}$ (for example at room temperature) and a similar approach can be applied for the calculation of the dimensions of the holder at $T_{final}$, except that consideration is given to the shape and dimensions of the holder and the linear thermal expansion coefficient of the holder material.

Preferably, the gap widths between the plate and the holder are selected so that the plate can freely expand inside the holder up to a temperature of at least 450° C., preferably at least 500° C., even more preferably up to at least 650° C.

According to the present invention the linear thermal expansion coefficient of the plate material is greater than the linear thermal expansion coefficient of the holder material, i.e. α1>α2.

Preferably, the plate is disc-shaped.

Preferably, the recesses and/or protrusions in the plate are distributed equidistantly from one another.

Preferably, the holder is annular or has an annular part for accommodating the plate.

According to another preferred embodiment of the present invention, the plate can be a disc-shaped target that has guides (protrusions), which are arranged in a star pattern, whose shared axis is located in the target center, and which guides protrude into corresponding grooves (recesses) of the holder that are arranged in a star pattern. For example, the holder is a part of a cooling plate device. The target is therefore centered on the cooling plate in a temperature-independent fashion by the target cooling plate design according to the invention. Consequently in the case of the use of an anode ring around the target, it is possible for the gap between the target and anode ring to remain concentric and for it to be kept concentric according to the invention.

It is thus possible to avoid short circuits, which can occur due to an unintended contact between the target, which is operated as a cathode, and the anode ring.

Also as a result of this, the contact surface between the target and the target holder in the cooling plate device (e.g. between the target and a target holder ring) remains concentric and when toil cooling plates are used, uniform stresses are produced in the target. It is thus possible to minimize the contact area.

In lieu of providing recesses in the cooling plate into which lugs (protrusions) from the target protrude, it is also possible to provide recesses in the target and to embody the receiving body of the cooling plate device, for example the target holding ring, with inward-projecting protrusions that engage in the recesses of the target, as shown in FIG. 4.

A particular advantage is achieved by the use of the present invention in existing cooling plates in which an excessively small gap between the target and the cooling, plate can be enlarged through the use of a spacer ring. If the target is mounted in a spacer ring, and this ring is then mounted to the cooling plate, it is then possible to increase the overall play (play 1 and play 2) between the target and the cooling plate and thus also to increase the amount of power used, as shown in FIG. 5.

The invention will now be explained in greater detail in conjunction with the figures.

DETAILED DESCRIPTION OF THE PREFERRED EMBODIMENTS

Figure 1:
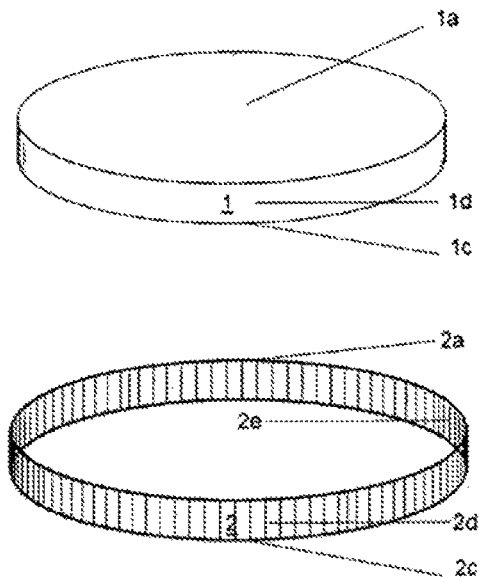
FIG. 1 schematically depicts a target and a holder.
Figure 2:
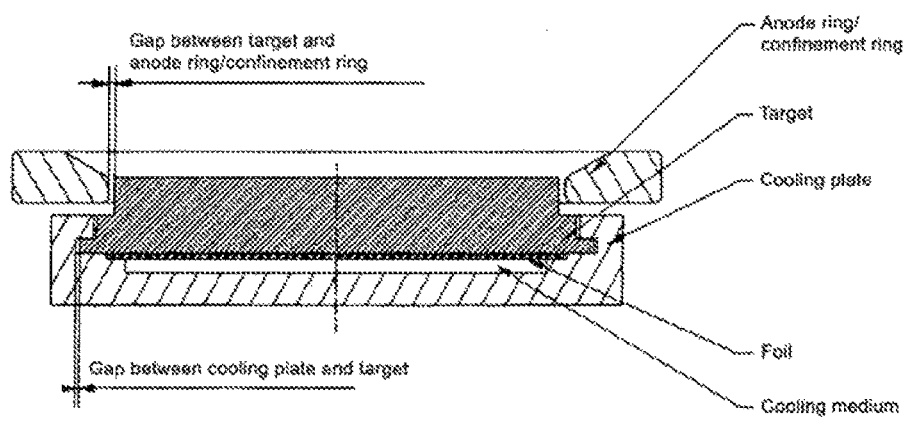
FIG. 2 shows a coating source with a target, a cooling plate, and an anode ring.
Figure 3:
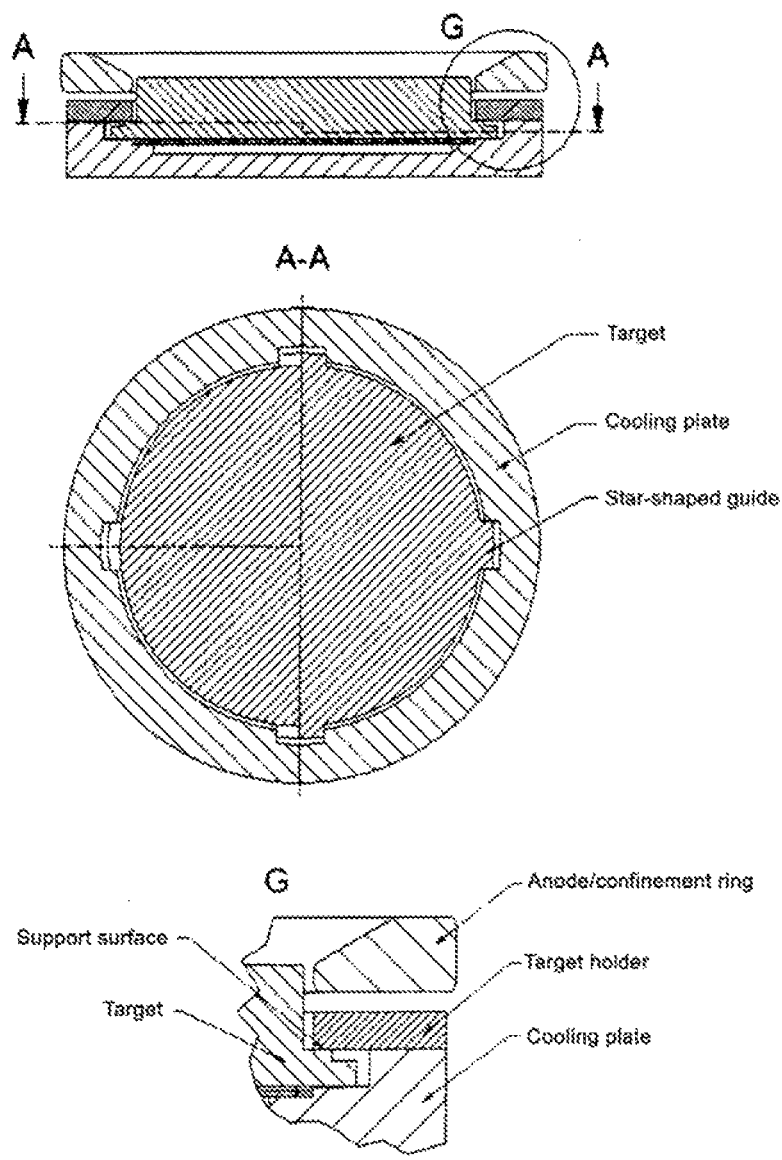
FIG. 3 shows cross-section through a detail of an embodiment of the plate with holder according to the invention, viewed from above.
Figure 4:
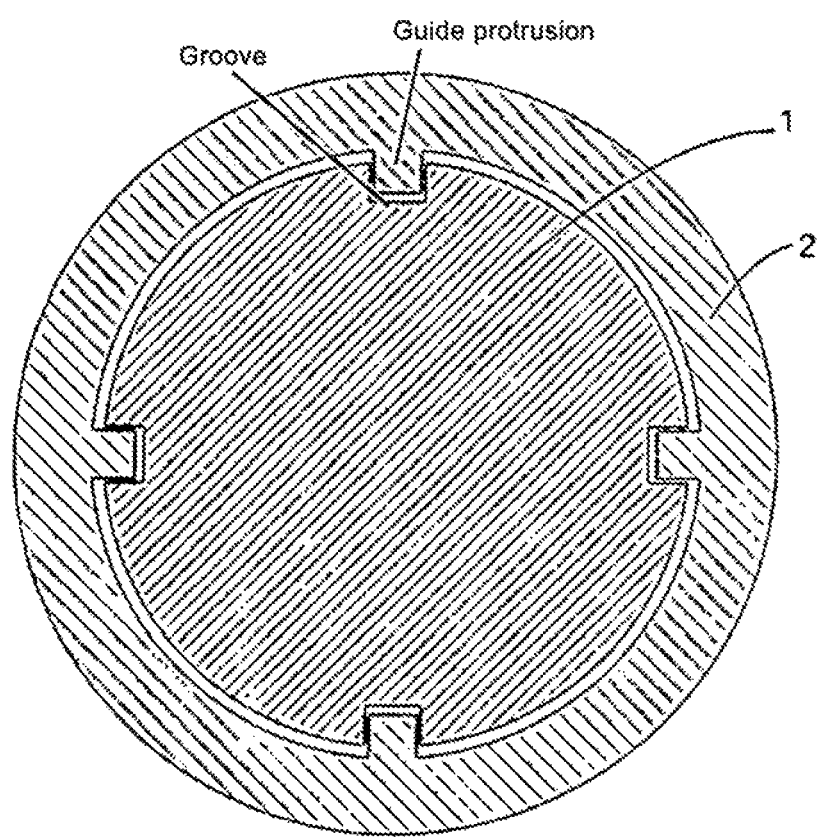
FIG. 4 shows a top view of an embodiment of the plate with holder according to the invention.
Figure 5:
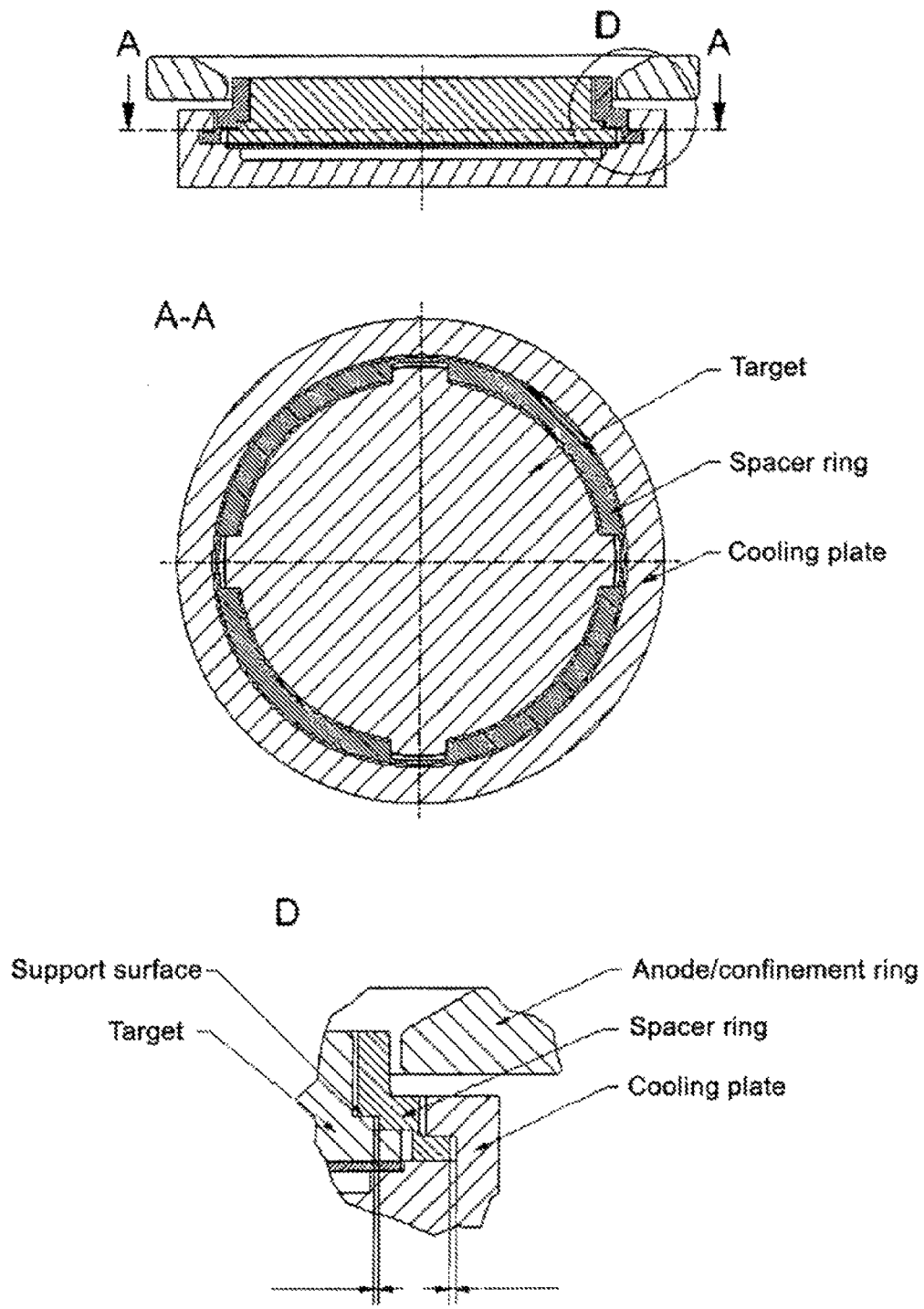
FIG. 5 shows a detail of the cross-section of an embodiment of the present invention.
Figure 6:
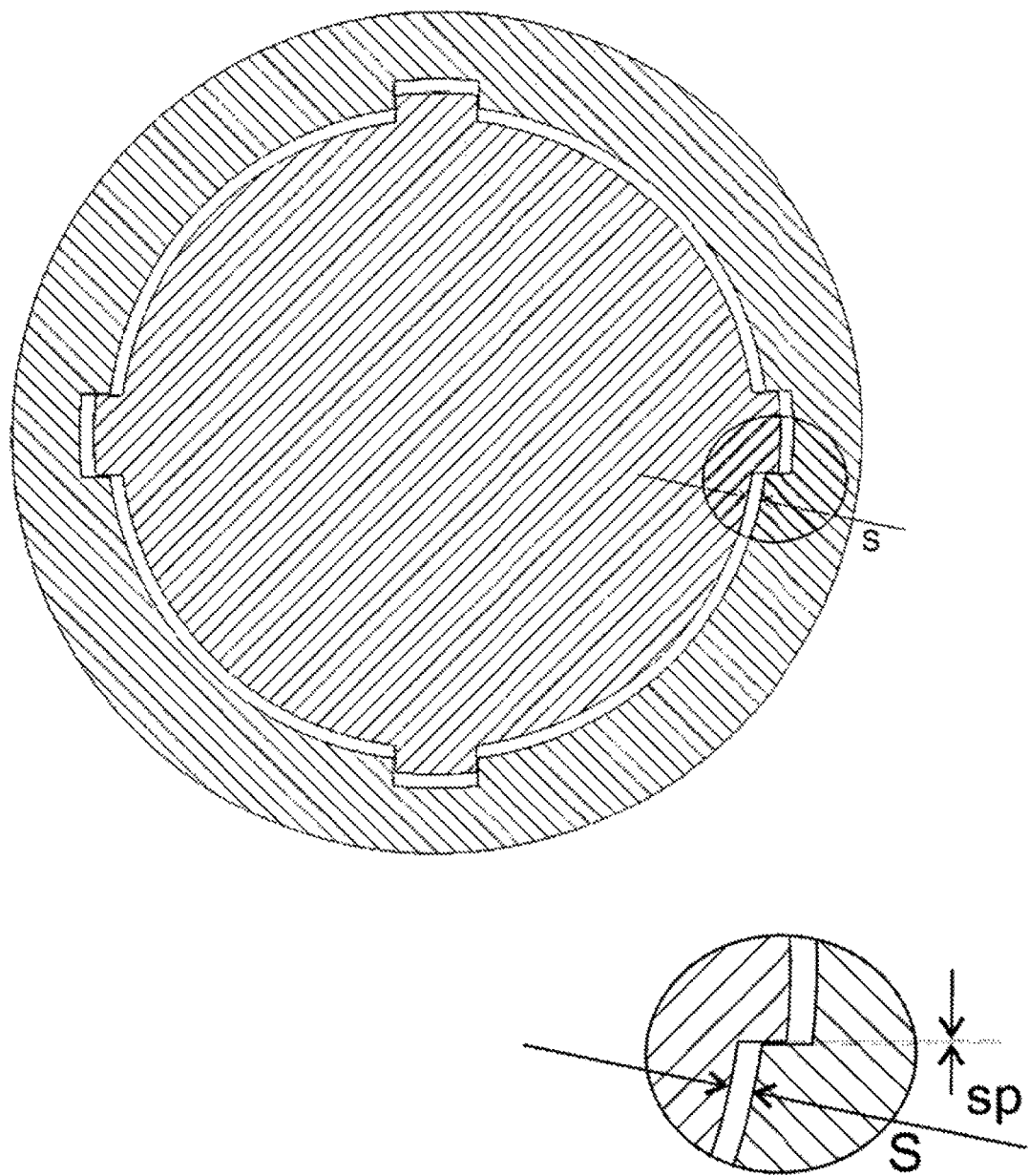
FIG. 6 shows a plate with holder according to the invention in a top view and a detail relating thereto.
Figure 7:
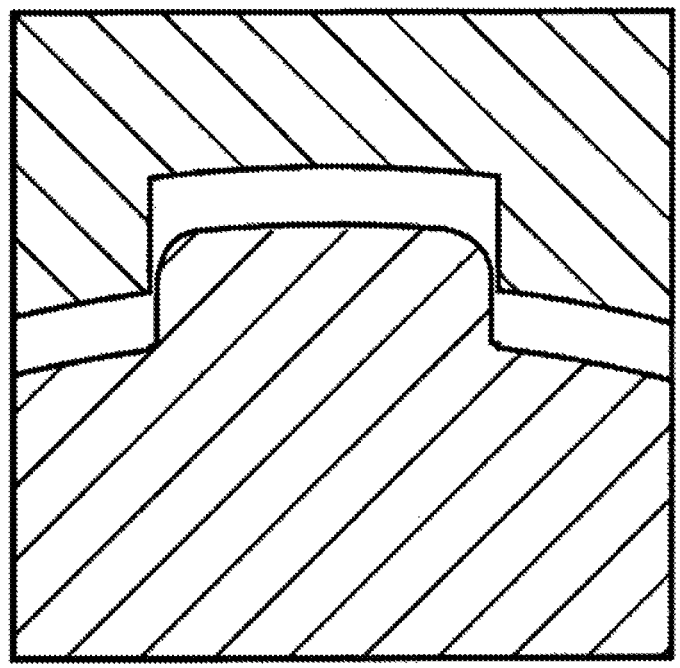
FIG. 7 shows a recess/protrusion pair in which the protrusion has rounded areas.
Figure 8:
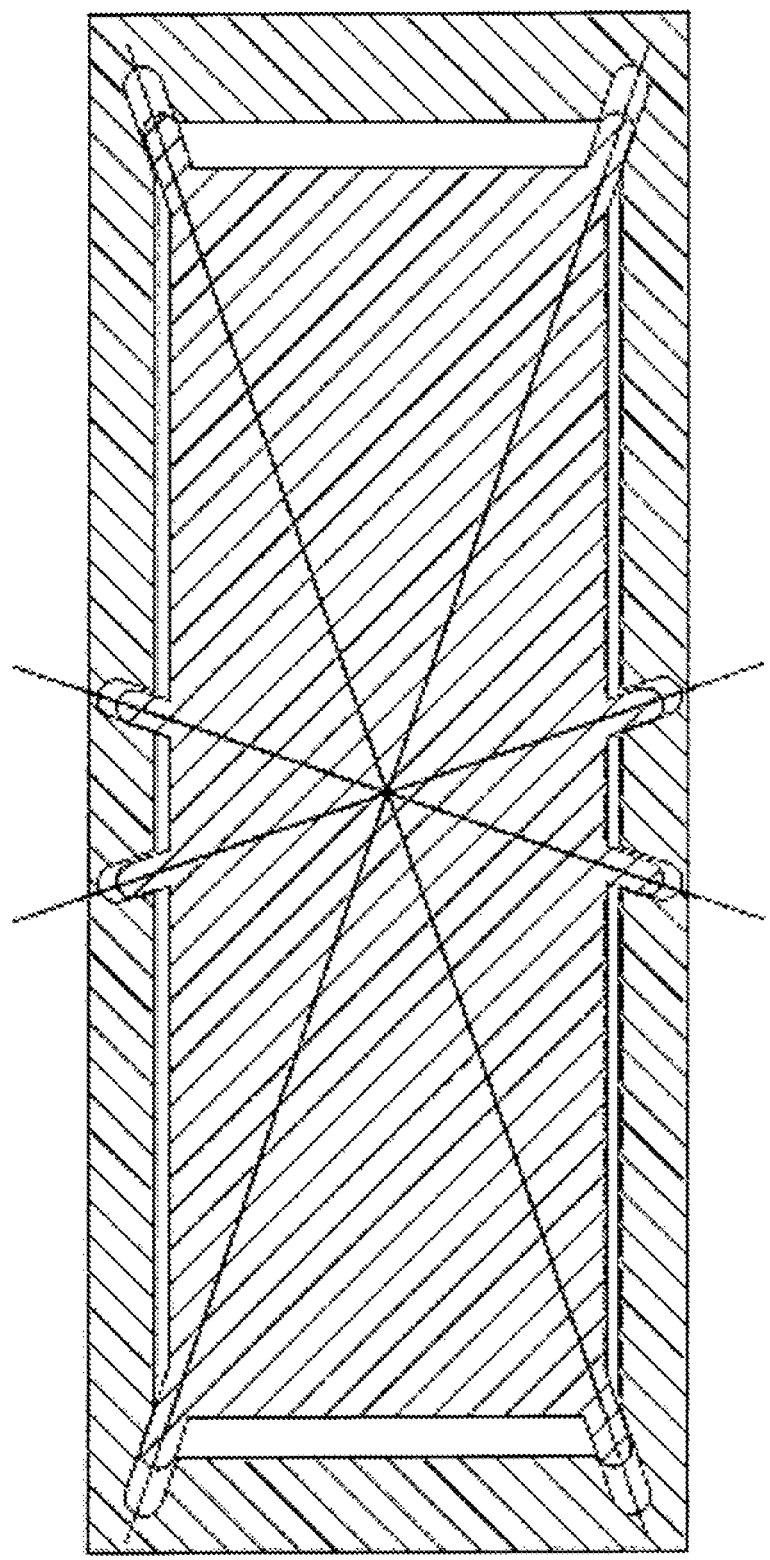
FIG. 8 shows a plate with holder according to the invention in a top view in which the plate has a rectangular surface.

What has been disclosed is a disc-shaped plate with a holder, which together constitute a system "plate-holder," in which the plate has a circular surface extending across wide regions of its circumference and has an outer plate edge, and the material of the plate has a first thermal expansion coefficient α1 and the holder has a circular opening extending across wide regions of its circumference, which is delimited by an inner holder edge, and the material of the holder has a second thermal expansion coefficient α2, and at room temperature, the circumference of the opening of the holder is greater than the circumference of the surface of the plate, as a result of which with a centered position of the plate in the opening of the holder, there is a gap with a defined gap width S between the plate edge and the inner holder edge and α2<α1 and the plate edge has one or more protrusions, which, viewed from the center point of the circular surface, extend for protrusion lengths from the plate edge in the radial direction and engage in corresponding recesses with recess lengths of the holder edge and/or the plate edge has one or more recesses, which, viewed from the plate edge, extend for recess lengths toward the center point of the circular surface and are engaged by corresponding protrusions with protrusion lengths on the holder edge in which the "plate-holding" system has at least three such recess/protrusion pairs and for the recess/protrusion pairs, the corresponding radial lengths are matched to one another so that at room temperature, except for a radial spacing of at most d, the recesses are each engaged in the radial direction by the protrusion, where the size of the radial spacing d corresponds to the size of the gap width S and for the recess/protrusion pairs in the tangential direction, the corresponding width profiles are matched to each other so that the recess can function as a guide rail for the corresponding protrusion, whose play sp in the tangential direction is less than S, and as a result, both at room temperature and at higher temperatures, at which the plate expands more than the holder, the expanding plate is anchored so that it is always centered in the holder except for at most the play sp.

For the above-described plate with a holder, preferably the gap width S, the radial spacing d, and the play sp can be selected so that the plate can freely expand inside the holder up to a temperature of at least 450° C., preferably at least 500° C., even more preferably up to at least 650° C.

For the above-described plate with a holder, preferably the recesses and/or protrusions in the plate are distributed equidistantly from one another.

For the above-described plate with a holder, preferably the holder is annular or has an annular part for accommodating the plate.

For the above-described plate with a holder, preferably four recess/protrusion pairs are provided.

In the above-described plate-holding system, the plate can be a target for use in a PVD process and the plate-holding system can be part of a corresponding coating source.

The above-described coating source can be provided with means for connecting to a voltage source, which make it possible to apply a negative potential to the target relative to an electrode so that the target can be used as a cathode and the electrode can be used as an anode.

In the above-described coating source, parts of the holder can constitute at least a part of a cooling device.

The above-described holder can be embodied as a spacer ring.

The cooling device can preferably be a device of the foil cooling plate type.

The above-mentioned anode can preferably be placed around the target and is embodied as an anode ring.

In the above-described plate with a holder, the play sp can preferably be half the size of the gap width S and particularly preferably, can be an order of magnitude smaller than the gap width S.

In the above-described plate with a holder, the width profile in the guide regions of at least one of the protrusions, preferably of several of the protrusions, and particularly preferably of all of the protrusions, in the axial direction i) can have no edges, which makes it impossible for a jamming to occur in the guide rail that is formed by the corresponding recess or ii) can have parallel, straight walls at least in the radial subsection in which the recess is guided.

In the above-described plate with a holder, the width profile of at least one recess, preferably of several recesses, and particularly preferably of all of the recesses, at least in the radial subsection in which the recess performs the guiding, function, i) can have parallel, straight walls or can have no edges, which makes it impossible for a jamming to occur with the corresponding protrusion in the guide rail that is formed by the recess.

Preferably in one, several, or all of the recess/protrusion pairs, either the above-described alternatives i) are simultaneously fulfilled or the above-described alternatives ii) are simultaneously fulfilled.

A PVD system with at least one coating source as described above has also been disclosed.

The invention claimed is:

1. A disc-shaped plate with a holder, which together constitute a system "plate-holder," comprising:

the disc-shaped plate having a circular surface extending across regions of its circumference and having an outer plate edge, and the plate consists essentially of a material having a first thermal expansion coefficient α1; and the holder having a circular opening extending across regions of its circumference, which is delimited by an inner holder edge, and the holder consists essentially of a material having a second thermal expansion coefficient α2;

wherein, at room temperature, a circumference of the opening of the holder is greater than the circumference of the surface of the plate, as a result of which with a centered position of the plate in the opening of the holder, there is a gap with a defined gap width S between the outer plate edge and the inner holder edge; and α2<α1; and the outer plate edge has one or more protrusions, which, viewed from a center point of the circular surface, extend for protrusion lengths from the outer plate edge in a radial direction and engage in corresponding recesses with recess lengths of the inner holder edge and/or the outer plate edge has one or more recesses, which, viewed from the outer plate edge, extend for recess lengths toward the center point of the circular surface and are engaged by corresponding protrusions with protrusion lengths on the inner holder edge;

the system "plate-holder" has at least three such recess/protrusion pairs; and for the recess/protrusion pairs, the lengths are selected so that at room temperature, except for a radial spacing of at most d, the recesses are each engaged in the radial direction by a protrusion, whose size corresponds to the size of the gap width S; and for the recess/protrusion pairs in a tangential direction, width profiles are matched to each other so that a recess can function as a guide rail for a corresponding protrusion, whose play sp in the tangential direction is less than S, and as a result, both at room temperature and at higher temperatures, at which the plate expands more than the holder, the expanding plate is anchored so that the plate is always centered in the holder except for at most the play sp; and wherein the width profile in guide regions of at least one of the protrusions in an axial direction i) has no edges, which makes it impossible for a jamming to occur in the guide rail that is formed by the corresponding recess or ii) has parallel, straight walls at least in a radial subsection in which the recess is guided.

2. The plate with a holder according to claim 1, wherein the gap width S, the radial spacing d, and the play sp are selected so that the plate can freely expand inside the holder up to a temperature of at least 450° C.

3. The plate with a holder according, to claim 2, wherein the recesses and/or protrusions in the plate are distributed equidistantly from one another.

4. The plate with a holder according to claim 1, wherein the holder is annular or has an annular part for accommodating the plate.

5. The plate with a holder according to claim 1, wherein four recess/protrusion pairs are provided.

6. The plate with a holder according to claim 1, wherein the plate is a target for use in a PVD process and the system "plate-holder" is part of a corresponding coating source.

7. The plate with a holder according to claim 6, wherein the coating source can be connected to a voltage source, which make it possible to apply a negative potential to a target relative to an electrode so that the target can be used as a cathode and the electrode can be used as an anode.

8. The plate with a holder according to claim 7, wherein at least parts of the holder can constitute at least a part of a cooling device.

9. The plate with a holder according to claim 8, wherein the holder is embodied as a spacer ring.

10. The plate with a holder according to claim 8, wherein the cooling device is a type of foil cooling plate.

11. The plate with a holder according to claim 7, wherein the anode is placed around the target and is embodied as an anode ring.

12. The plate with a holder according to claim 1, wherein the play sp is at most half the size of the gap width S.

13. The plate with a holder according to claim 1, wherein the width profile of at least one recess at least in a radial subsection in which the recess performs the guiding function, i) has parallel, straight walls or ii) has no edges, which makes it impossible for a jamming to occur in the guide rail that is formed by the corresponding recess.

14. The plate with a holder according to claim 1, wherein for at least one recess/protrusion pair the alternative i) or the alternative ii) is implemented.

15. A PVD system with at least one coating source according to claim 6.

16. The plate with a holder according to claim 13, wherein for at least one recess/protrusion pair, the alternative i) or the alternative ii) is implemented.

* * * * *